United States Patent
Sakaguchi

(10) Patent No.: US 6,737,997 B2
(45) Date of Patent: May 18, 2004

(54) DATA CONVERSION APPARATUS AND DATA CONVERSION METHOD

(75) Inventor: Hiroaki Sakaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/462,503

(22) Filed: Jun. 16, 2003

(65) Prior Publication Data

US 2003/0231121 A1 Dec. 18, 2003

(30) Foreign Application Priority Data

Jun. 18, 2002 (JP) .................................. P2002-176995

(51) Int. Cl.⁷ ............................ H03M 7/02; H03M 7/00
(52) U.S. Cl. ................................... 341/83; 341/50
(58) Field of Search .............................. 341/83, 50, 61, 341/88, 145, 156; 704/500; 711/173; 382/260

(56) References Cited

U.S. PATENT DOCUMENTS 5,007,099 A * 4/1991 Matsushima et al. ....... 382/260
5,719,998 A * 2/1998 Ku et al. ..................... 704/500
6,178,489 B1 * 1/2001 Singh ......................... 711/173

FOREIGN PATENT DOCUMENTS

JP  402083735 A * 3/1990

* cited by examiner

Primary Examiner—Jean Jeanglaude
(74) Attorney, Agent, or Firm—Frommer Lawrence & Haug LLP; William S. Frommer

(57) ABSTRACT

A data conversion apparatus and a data conversion method are disclosed by which, when data of a format used in a processing apparatus is to be written into a memory, it can be written in a compressed form and, when the data is to be read out from the memory, it can be read out in a decompressed form. An address conversion section converts an address from the processing apparatus side from an address of a floating-point data space into an address of a fixed-point data space. A data compression section converts data of a floating-point format from the processing apparatus side into data of a fixed-point format. A data decompression section converts data of the fixed-point format from the memory side into data of the floating-point format. A predetermined portion of the address is utilized, upon the data conversion, as an exponent part of the data of the fixed-point format.

20 Claims, 13 Drawing Sheets

F I G. 5
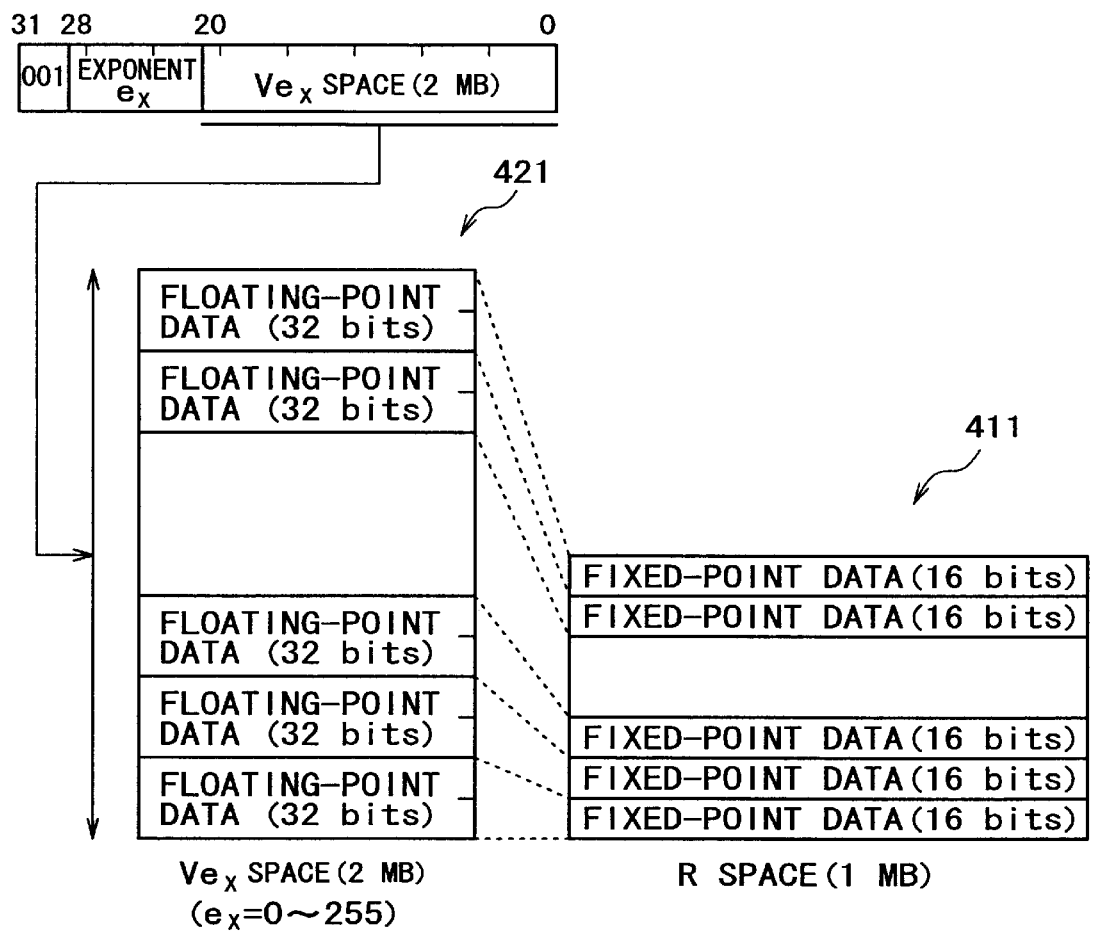

DATA CONVERSION APPARATUS AND DATA CONVERSION METHOD

BACKGROUND OF THE INVENTION

This invention relates to a data conversion apparatus and a data conversion method, and more particularly to a data conversion apparatus and a data conversion method which compresses data, writes the compressed data into a memory, reads out the data from the memory and decompresses the read out data.

Two formats for representing a real number in a binary number of a fixed finite length are available including a fixed-point format and a floating-point format. The fixed-point format represents a real number with the decimal point fixed to a particular position and usually has a configuration including a sign bit added to a part which represents a numerical value. Meanwhile, the floating-point format represents a certain number y in a combination of an r-ary fixed-point number f (mantissa part) and an r-ary integer e (characteristic or exponent part) wherein r is an integer and makes a base. In this instance, the number y is a result of multiplication of the mantissa part f by r to the eth power, that is, $y=f \times r^e$. Usually, r=2 is used as the base, and a sign bit is added to the number y.

Since the fixed-point format has the characteristic that the decimal point position is fixed, it is narrow in dynamic range and is limited in the range within which it can represent real numbers. Therefore, when to actually prepare a program, a technique is utilized that a numerical value portion of the fixed-point format is regarded as the mantissa part and the exponent part is held in another variable to suitably change the decimal point position. In this instance, however, it is necessary to grasp the dynamic range of arithmetic operation to set the exponent part so that an overflow or an underflow may not occur.

In contrast, the floating-point format allows arithmetic operation to be performed while the finite precision of the mantissa part is maintained and achieves a wide dynamic range through variation of the exponent part. Therefore, the dynamic range may be grasped roughly, and a program can be developed efficiently. Particularly a processing apparatus which has a floating-point arithmetic unit can perform numerical arithmetic operation of the floating-point format at a high speed.

However, the floating-point format requires a greater number of bits than the fixed-point format because the mantissa part is included in data. For example, while a format used popularly as the fixed-point format handles 16-bit data including a numerical value portion of 15 bits, data of the single precision floating-point format according to the IEEE (Institute of Electrical and Electronics Engineers) standards (IEEE standards 754-1985) are 32-bit data including the mantissa part of 23 bits. The problem of the data capacity is particularly serious where a large number data of the floating-point format are prepared in a table and used for arithmetic operation.

In order to implement a sampling rate converter, for example, from 41 KHz to 32 KHz, a FIR (Finite-duration Impulse Response) filter having 512 to 1024 taps (coefficients) must be constructed, and in order to hold the coefficients in a table, it is required to make the data compact to the utmost.

SUMMARY OF THE INVENTION

It is an object of the present invention to provide a data conversion apparatus and a data conversion method by which, when data of a format used in a processing apparatus is to be written into a memory, it can be written in a compressed form and, when the data is to be read out from the memory, it can be read out in a decompressed form.

In order to attain the object described above, according to an aspect of the present invention is provided a data conversion apparatus, including approximation means operable when a writing instruction for writing first data having a first format into a memory is received from a processing apparatus for approximating the first data with a predetermined portion of a write address directed by the writing instruction and second data having a second format, and conversion data writing means for writing the second data specified by the approximation means in place of the first data into the memory. With the data conversion apparatus, the data having the first format is approximated with the predetermined portion of the write address corresponding to the writing instruction received from the processing apparatus and the second data having the second format.

According to another aspect of the present invention, there is provided a data conversion apparatus, including approximation means operable when a reading instruction for reading out first data having a first format from a memory is received from a processing apparatus for approximating the first data with a predetermined portion of a read address directed by the reading instruction and second data having a second format, and conversion data reading means for reading out the second data specified by the approximation means in place of the first data from the memory. With the data conversion apparatus, the data having the first format is approximated with the predetermined portion of the read address corresponding to the reading instruction received from the processing apparatus and the second data having the second format.

According to a further aspect of the present invention, there is provided a data conversion apparatus which converts, in response to a writing instruction outputted from a processing apparatus for writing data of a first format into a memory, the data of the first format into data of a second format, including means for generating a signal according to a predetermined portion of a write address directed by the writing instruction outputted from the processing apparatus and a first predetermined portion of the data of the first format, and means for performing a predetermined operation for a second predetermined portion of the data of the first format in accordance with said signal to obtain a predetermined portion of the data of the second format. With the data conversion apparatus, the data of the first format is approximated with the predetermined portion of the write address corresponding to the writing instruction outputted from the processing apparatus and the data having the second format.

According to a still further aspect of the present invention, there is provided a data conversion apparatus which converts, in response to a reading instruction outputted from a processing apparatus for reading out data of a first format from a memory, data of a second format outputted from the memory into data of the first format which includes a first predetermined portion and a second predetermined portion, including means for repetitively performing a predetermined operation for a predetermined portion of the data of the second format until a predetermined condition is satisfied to obtain the second predetermined portion of data of the first format, and means for determining the first predetermined portion of the data of the first format based on a predetermined portion of a read address directed by the reading instruction outputted from the processing apparatus and the number of times by which the predetermined operation is performed. With the data conversion apparatus, the data of the first format is approximated with the predetermined portion of the read address corresponding to the reading instruction outputted from the processing apparatus and the data having the second format.

According to a yet further aspect of the present invention, there is provided a data conversion method for converting, in response to a writing instruction outputted from a processing apparatus for writing data of a first format into a memory, the data of the first format into data of a second format, including the steps of generating a signal according to a predetermined portion of a write address directed by the writing instruction outputted from the processing apparatus and a first predetermined portion of the data of the first format, and performing a predetermined operation for a second predetermined portion of the data of the first format in accordance with said signal to obtain a predetermined portion of the data of the second format. With the data conversion method, the data of the first format is approximated with the predetermined portion of the write address corresponding to the writing instruction outputted from the processing apparatus and the data having the second format.

With the data conversion apparatus and the data conversion method of the present invention described above, when data of the format used in the processing apparatus is to be written into the memory, it can be written in a compressed form. Then, when the data is to be read out from the memory, it can be read out in a decompressed form. Consequently, the used amount of the memory, that is, the capacity of the memory, can be reduced without restricting processing of the processing apparatus.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 5 is a diagrammatic view illustrating data in the floating-point data space and data in the fixed-point data space illustrated in FIG. 4;

DETAILED DESCRIPTION OF THE PREFERRED EMBODIMENTS

Figure 1:
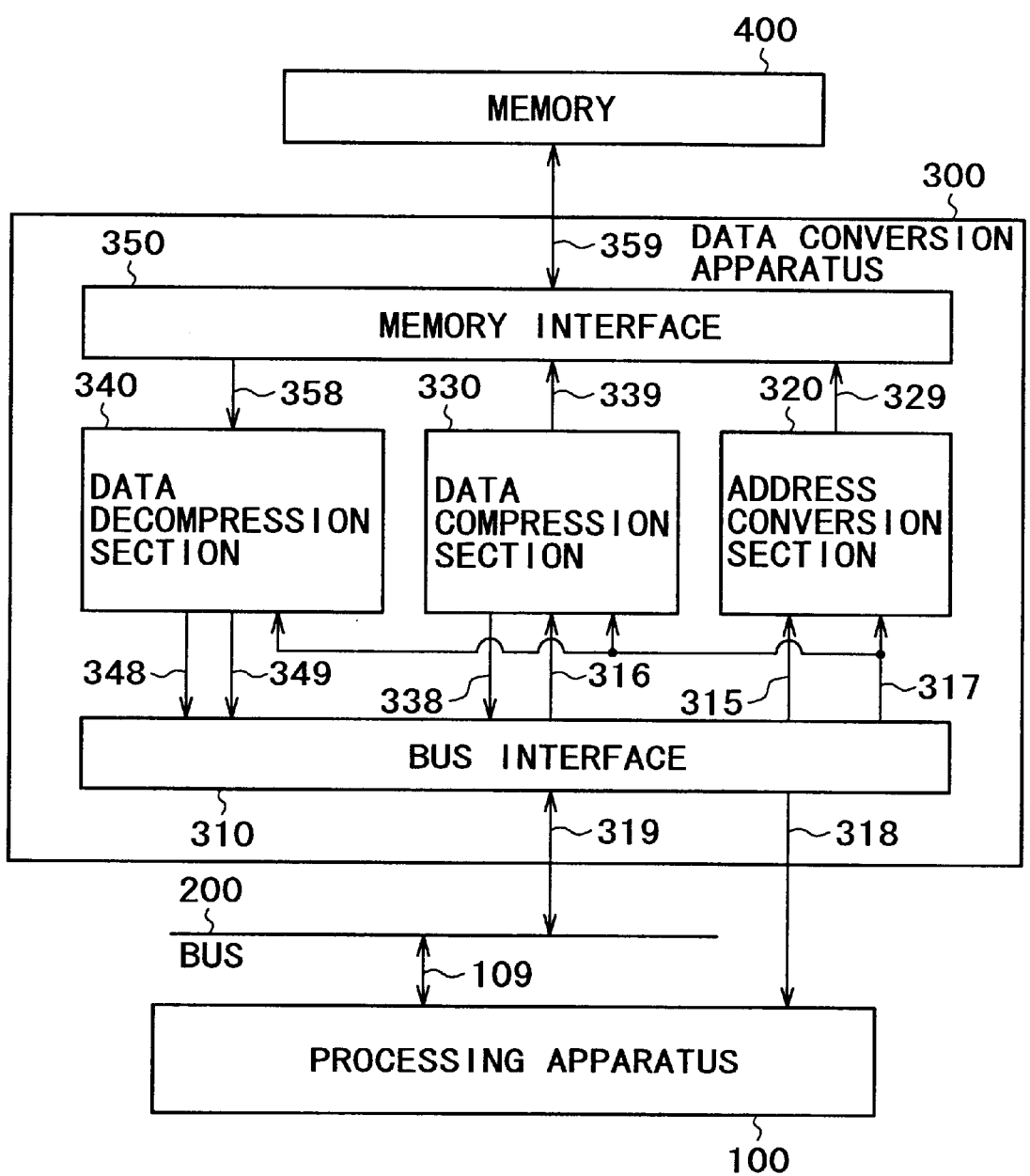
FIG. 1 is a block diagram showing a data conversion apparatus to which the present invention is applied.

Referring first to FIG. 1, there is shown a data conversion apparatus to which the present invention is applied. The data conversion apparatus 300 shown is connected to a processing apparatus 100 through a bus 200 and connected also to a memory 400. The data conversion apparatus 300 includes a bus interface 310 connected to a bus 200, a memory interface 350 connected to the memory 400, an address conversion section 320 for converting an address from the bus interface 310, a data compression section 330 for compressing the data from the bus interface 310, and a data decompression section 340 for decompressing data from the memory interface 350.

The bus 200 and the bus interface 310 are connected to each other by a signal line 319. The signal line 319 may include, for example, an address line of 32 bits and a data line of 32 bits. Meanwhile, the processing apparatus 100 and the bus interface 310 are connected to each other by an interruption signal line 318. The interruption signal line 318 is used to report occurrence of an interruption from the bus interface 310 to the processing apparatus 100.

The bus interface 310 is connected to the address conversion section 320, data compression section 330 and data decompression section 340 by an address signal line 317. The address signal line 317 outputs a write address of a writing instruction into the memory 400 and a read address of a reading instruction from the memory 400 from the bus interface 310 to the address conversion section 320, data compression section 330 and data decompression section 340.

The bus interface 310 and the address conversion section 320 are connected to each other by a base address signal line 315. The base address signal line 315 is used to output a base address stored in a control register of the bus interface 310 from the bus interface 310 to the address conversion section 320.

The bus interface 310 and the data compression section 330 are connected to each other by a data signal line 316. The data signal line 316 is used to output write data of a writing instruction from the bus interface 310 to the data compression section 330. Further, the bus interface 310 and the data compression section 330 are connected to each other by an interruption signal line 338. The interruption signal line 338 is used output occurrence of an interruption in the data compression section 330 to the bus interface 310.

The bus interface 310 and the data decompression section 340 are connected to each other by a data signal line 349. The data signal line 349 is used to output read data of a reading instruction from the data decompression section 340 to the bus interface 310. Further, the bus interface 310 and the data decompression section 340 are connected to each other by an interruption signal line 348. The interruption signal line 348 is used to output occurrence of an interruption in the data decompression section 340 to the bus interface 310.

The memory interface 350 and the address conversion section 320 are connected to each other by an address signal line 329. The address signal line 329 is used to output a write address of a writing instruction into the memory 400 or a read address of a reading instruction from the memory 400 from the address conversion section 320 to the memory interface 350.

The memory interface 350 and the data compression section 330 are connected to each other by a data signal line 339. The data signal line 339 is used to output write data of a writing instruction into the memory 400 from the data compression section 330 to the memory interface 350.

The memory interface 350 and the data decompression section 340 are connected to each other by a data signal line 358. The data signal line 358 is used to output read data of a reading instruction from the memory 400 from the memory interface 350 to the data decompression section 340.

The memory interface 350 and the memory 400 are connected to each other by a signal line 359. The signal line 359 can include, for example, an address line of 28 bits and a data line of 16 bits.

The bus interface 310 receives a write address of a writing instruction into the memory 400 from the bus 200 or a read address of a reading instruction from the memory 400 from the bus 200 and outputs the received write or read address to the address conversion section 320, data compression section 330 and data decompression section 340. Further, the bus interface 310 receives write data of a writing instruction from the bus 200 and outputs the received write data to the data compression section 330. Furthermore, the bus interface 310 receives read data of a reading instruction from the data decompression section 340 and outputs the received read data to the bus 200.

Further, the bus interface 310 receives occurrence of an interruption in the data compression section 330 or the data decompression section 340 and controls whether or not the interruption should be reported to the processing apparatus 100. The bus interface 310 has control registers provided therein for storing internal states of the apparatus with regard to an interruption. When an interruption is to be reported, the states stored in the control registers are referred to by the processing apparatus 100. Further, a base address is stored in one of the control registers and used for address conversion by the address conversion section 320.

The address conversion section 320 receives a write address of a writing instruction into the memory 400 or a read address of a reading instruction from the memory 400 from the bus interface 310 and performs address conversion of the received write or read address. Upon such address conversion, the address received from the bus interface 310 through the base address signal line 315 is utilized as the base address.

The address conversion section 320 outputs the address after the address conversion to the address signal line 329 if the address received from the bus interface 310 is included in a predetermined region. However, if the address received from the bus interface 310 is not included in the predetermined region, then the address conversion section 320 outputs the original address before the address conversion as it is to the address signal line 329.

The data compression section 330 compresses write data into the memory 400 received from the bus interface 310. As an example, the data compression section 330 converts 32-bit data of the floating-point format into 16-bit data of the fixed-point format. The data compression section 330 outputs the data after the conversion to the data signal line 339 if the write address is included in a predetermined region, but outputs the data before the conversion as it is to the data signal line 339 if the write address is outside of the predetermined region. Further, if an interruption occurs in the process of compression, then the data compression section 330 informs the bus interface 310 of a notification representing the occurrence of an interruption through the interruption signal line 338.

The data decompression section 340 decompresses read data from the memory 400 received from the memory interface 350. As an example, the data decompression section 340 converts 16-bit data of the fixed-point format into 32-bit data of the floating-point format. The data decompression section 340 outputs the data after the conversion to the data signal line 349 if the read address is included in a predetermined region. However, the data decompression section 340 outputs the data before the conversion as it is to the data signal line 349 if the read address is outside of the predetermined region. Further, if an interruption occurs in the process of decompression, then the data decompression section 340 informs the bus interface 310 of a notification representing the occurrence of an interruption through the interruption signal line 348.

The memory interface 350 outputs a write address from the address conversion section 320 and write data from the data compression section 330 to the memory 400. Further, the memory interface 350 outputs a read address from the address conversion section 320 to the memory 400 and outputs read data read out from the memory 400 to the data decompression section 340.

Now, an example of a data format used in the data conversion apparatus of the present embodiment is described.

Figure 2A:
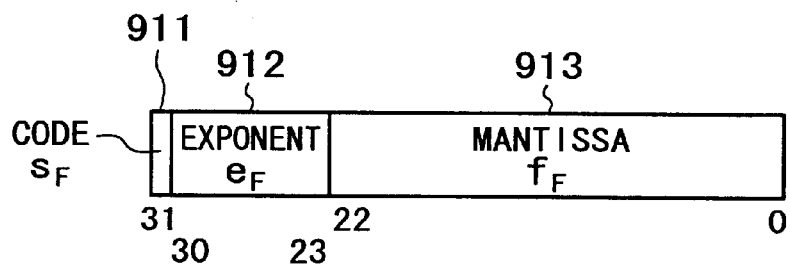
FIGS. 2A, 2B and 2C are diagrammatic views illustrating data formats used in the data conversion apparatus of FIG. 1.

Referring to FIG. 2A, there is illustrated, as an example of data of the floating-point format, data of the single-precision floating-point format according to the IEEE standards. The data illustrated includes a code part $s_F$ 911 of 1 bit, an exponent part $e_F$ 912 of 8 bits, and a mantissa part $f_F$ 913 of 23 bits. A value y represented by the data is given by $$y=(-1)^{s_F} \times 2^{e_F-127} \times (1+f_F \times 2^{-23}) \tag{1}$$

It is to be noted that, where the exponent part $e_F$=ffh (ff represented by the hexadecimal notation, that is, 255 as represented by the decimal notation: this similarly applies to the following description), if the mantissa part $f_F$=0 and the code part $s_F$=0, then the value y indicates the positive infinity, but if the mantissa part $f_F$=0 and the code part $s_F$=1, then the value y indicates the negative infinity, and if the mantissa part $f_F$ is any other than 0, then the value y indicates a NaN (Not a Number) value. On the other hand, where the exponent part $e_F$=0h, if the mantissa part $f_F$=0 and the code part $s_F$=0, then the value y represents positive zero, but if the mantissa part $f_F$=0 and the code part $s_F$=1, then the value y represents negative zero, and if the mantissa part $f_F$ is any other than 0, then the value y indicates a non-normalized value.

Figure 2B:
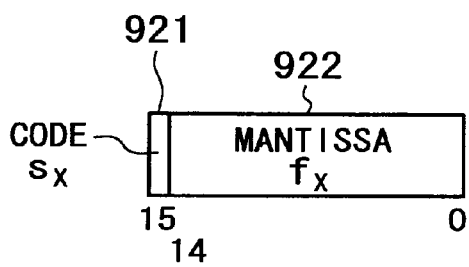

Referring now to FIG. 2B, there is shown 16-bit data of the fixed-point format as an example of data of the fixed-point format. The data illustrated includes a code part $s_x$ 921 of 1 bit, and a mantissa part $f_x$ 922 of 15 bits. If it is assumed that an exponent part $e_x$ of 8 bits has been stored in addition to the data of the fixed-point format illustrated, then a value y represented by the data is given by $$y=(-1)^{s_x} \times 2^{e_x-127} \times (f_x \times 2^{-15}) \tag{2}$$

It is to be noted that, if the mantissa part $f_x$=0 and the code part $s_x$=0, then the value y indicates zero, but if the mantissa part $f_x$=0 and the code part $s_x$=1, then the value y indicates a NaN value.

Figure 2C:
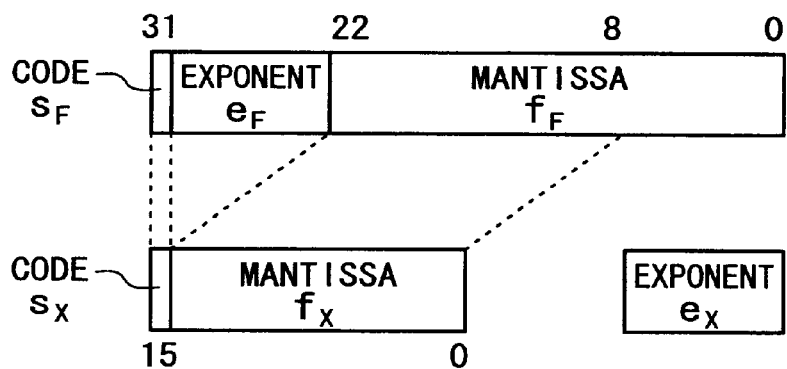

In the data conversion apparatus of the present embodiment, conversion between 32-bit data of the floating-point format and 16-bit data of the fixed-point format as an example of data conversion has such a corresponding relationship as illustrated in FIG. 2C. In particular, the sign parts of the two data are equal to each other. However, since the significant digits of the mantissa part of the data of the fixed-point format is smaller than that of the floating-point format, truncation or supplementation is required in the process of conversion. Further, since carry of the mantissa part is performed in the process of conversion, modification also to the exponent part is required accordingly.

Figure 3:
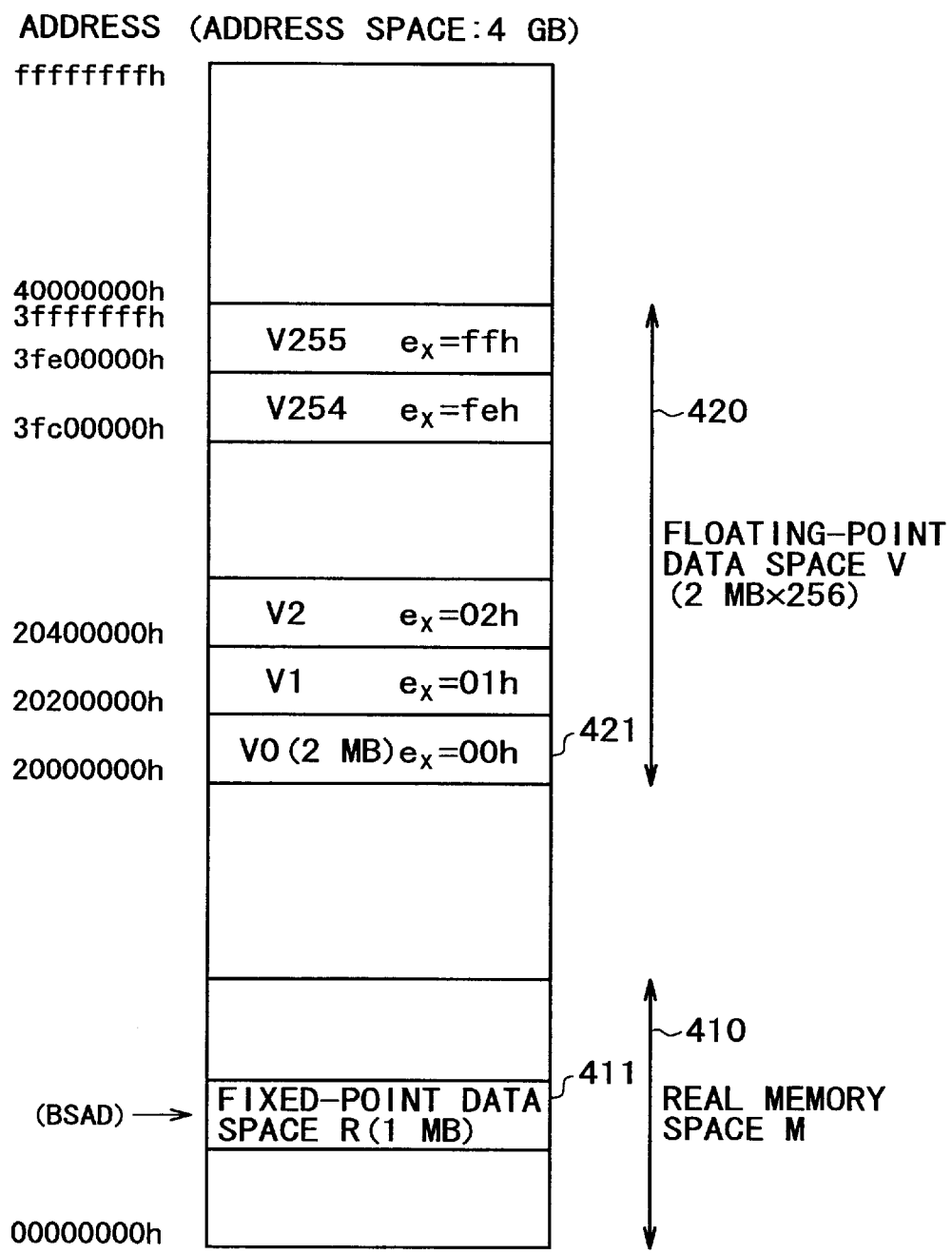
FIG. 3 is a diagrammatic view illustrating an address map used in the data conversion apparatus of FIG. 1.

Referring now to FIG. 3, there is illustrated an address space used in the data conversion apparatus of the present embodiment. If a 32-bit address system is assumed, then it allows representation an address of up to 4 GB (gigabytes). A real memory space M 410 prepared in the memory 400 is effective up to, for example, 512 MB (megabytes) in the maximum beginning with the address 00000000h. The real memory space M 410 includes a fixed-point data space R 411 in which data of the fixed-point format are to be actually stored in the memory 400. The fixed-point data space R 411 has a region of, for example 1 MB beginning with a start address provided as a base address from the bus interface 310.

On the other hand, a floating-point data space V 420 exists outside of the range of the real memory space M 410. The floating-point data space V 420 includes 256 sub spaces 421 (V0 to V255) in accordance with the value of the exponent part $e_x$ of 8 bits. Each of the sub spaces 421 has a region of, for example, 2 MB. Where the start address of the floating-point data space V 420 is, for example 20000000h, the last address of it is 3fffffffh.

Figure 4:
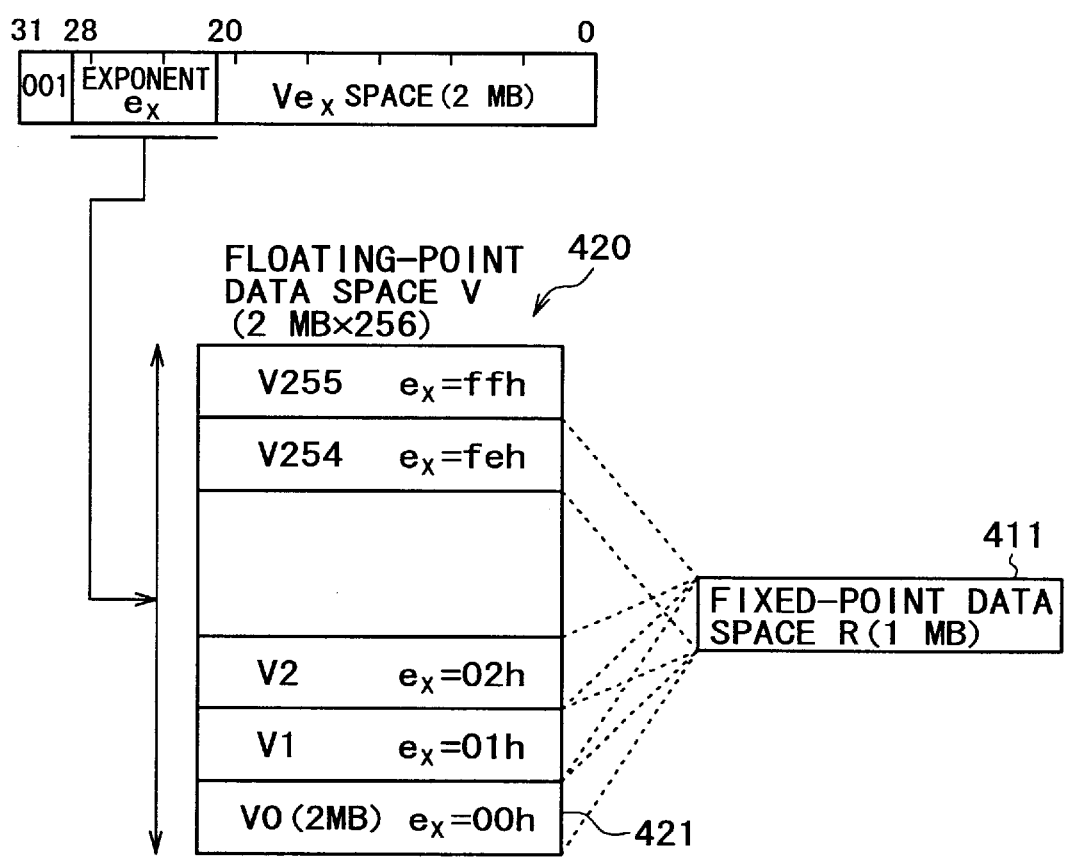
FIG. 4 is a diagrammatic view illustrating a relationship between a floating-point data space and a fixed-point data space in the data conversion apparatus of FIG. 1.

Referring to FIG. 4, if it is assumed that a bit number is applied to each of the bits of the address space of 32 bits in an ascending order from the least significant bit toward the most significant bit beginning with 0, then if the 3 bits at the 31st bit to the 29th bit are "001", then the address falls in the region of the floating-point data space V 420. Further, the 8 bits at the 28th bit to the 21st bit represent the value of the exponent part $e_x$, that is, the number of the sub space 421. The 21 bits (represented as $Ve_x$ space in FIG. 4) at the 20th bit to the 0th bit represent an address in the 2-MB space of the sub space 421. Each of the sub spaces 421 of the floating-point data space V 420 is mapped to the fixed-point data space R 411 as seen in FIG. 4 irrespective of the value of the exponent part $e_x$. It is to be noted, however, that, if the value of the exponent part $e_x$ is ffh (255), then the sub space 421 is mapped to the control register.

Referring now to FIG. 5, each of the sub spaces 421 has a region of 2 MB and can store 512 K (0.5 M) 32-bit data of the floating-point format. Meanwhile, the fixed-point data space R 411 has a region of 1 MB and can store 512 K (0.5 M) 16-bit data of the fixed-point format. Such 512 K data of each of the sub spaces 421 are mapped to 512 K data of the fixed-point data space R 411 as seen in FIG. 5. If this mechanism is utilized to allocate write data into the memory 400 to one of the sub spaces 421 of the floating-point data space V 420 from the processing aparatus 100 thereby to map the write data to the fixed-point data space R 411, then data of the floating-point format from the processing apparatus 100 can be written as data of the fixed-point format into the memory 400. Further, when data is to be read out from the memory 400, if one of the sub spaces 421 of the floating-point data space V 420 is designated to map the data to the fixed-point data space R 411, data written as data of the fixed-point format can be outputted as data of the floating-point format to the processing apparatus 100. In this process of conversion, the 8 bits at the 28th bit to the 21st bit of the address can be utilized as the exponent part $e_x$ of the data of the fixed-point format. Therefore, 16-bit data of the fixed-point format substantially functions as 24-bit data of the floating-format.

Now, a configuration of the data conversion apparatus according to the present embodiment is described in detail.

Figure 6:
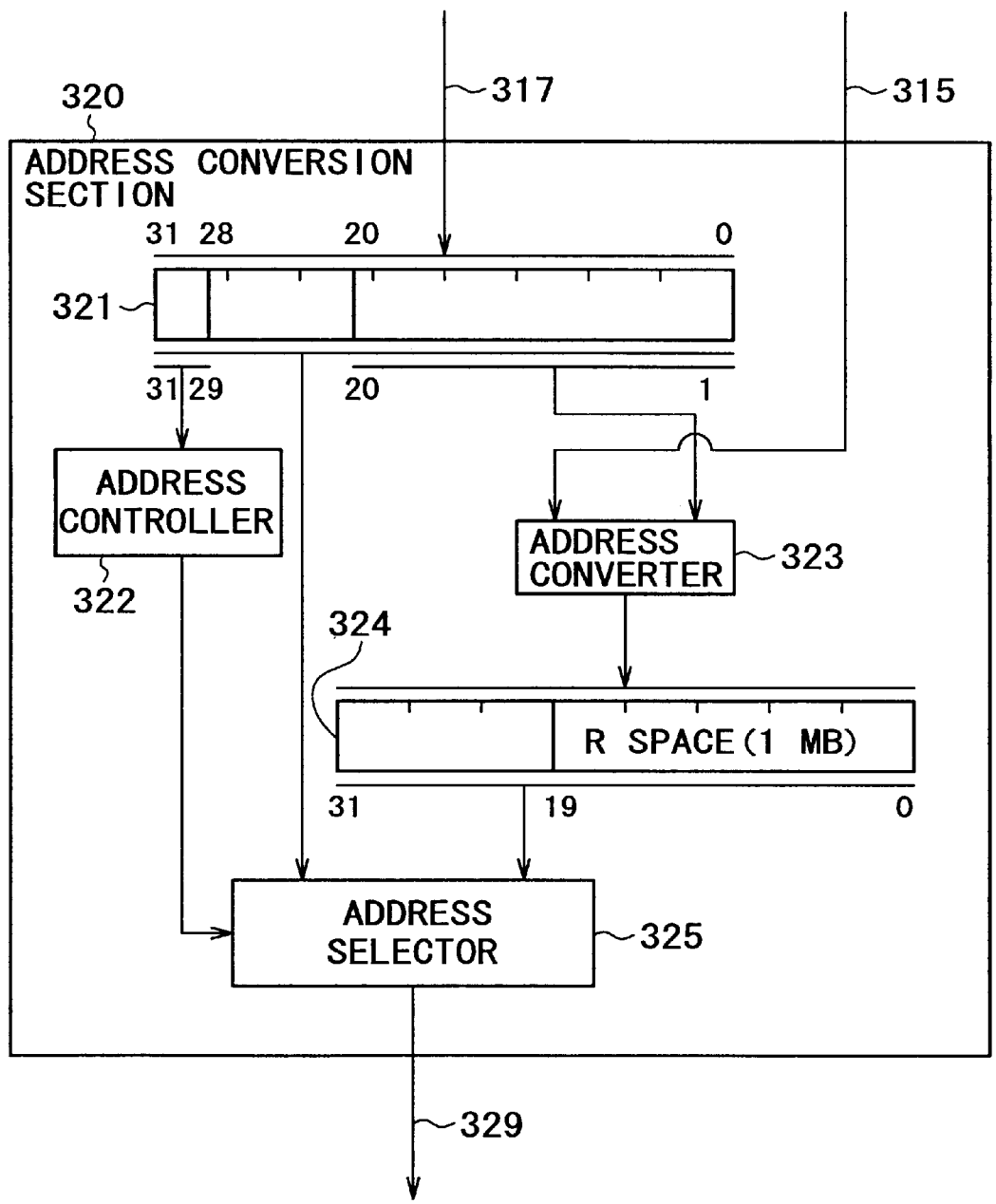
FIG. 6 is a block diagram showing a configuration of an address conversion section of the data conversion apparatus of FIG. 1.

Referring to FIG. 6, the address conversion section 320 includes an address controller 322, an address converter 323 and an address selector 325. In the address conversion section 320 shown in FIG. 6, an address 321 inputted from the bus interface 310 through the address signal line 317 is composed of 32 bits, and if the 3 bits at the 31st bit to the 29th bit of the address 321 are "001", then this signifies that the address is within the region of the floating-point data space V 420 (refer to FIG. 3). If the address is within the region of the floating-point data space V 420, then the 21 bits at the 20th bit to the 0th bit of the address 321 represent an address space of 2 MB in a sub space 421 (FIG. 3).

The address controller 322 discriminates whether or not the 3 bits at the 31st bit to the 29th bit of the address 321 are "001", that is, whether or not the address is within the region of the floating-point data space V 420 (FIG. 3).

The address converter 323 adds the 20 bits at the 20th bit to the 1st bit of the address 321 to the base address of the base address signal line 315 and outputs a resulting address. Since the 20 bits at the 20th bit to the 1st bit of the address 321 represent a 1-MB space, if the base address is represented in a unit of 1 MB, then the address converter need not be an adder but can be implemented by mere bit connection. An address 324 after the conversion outputted from the address converter 323 indicates an address in the fixed-point data space R 411 (FIG. 3) whose start address is the base address.

The address selector 325 outputs the address 324 after the conversion to the address signal line 329 if the address controller 322 discriminates that the address is within the region of the floating-point data space V 420 (FIG. 3). However, if the address controller 322 discriminates that the address is outside of the region of the floating-point data space V 420, then the address selector 325 outputs the address 321 before the conversion to the address signal line 329.

Figure 7:
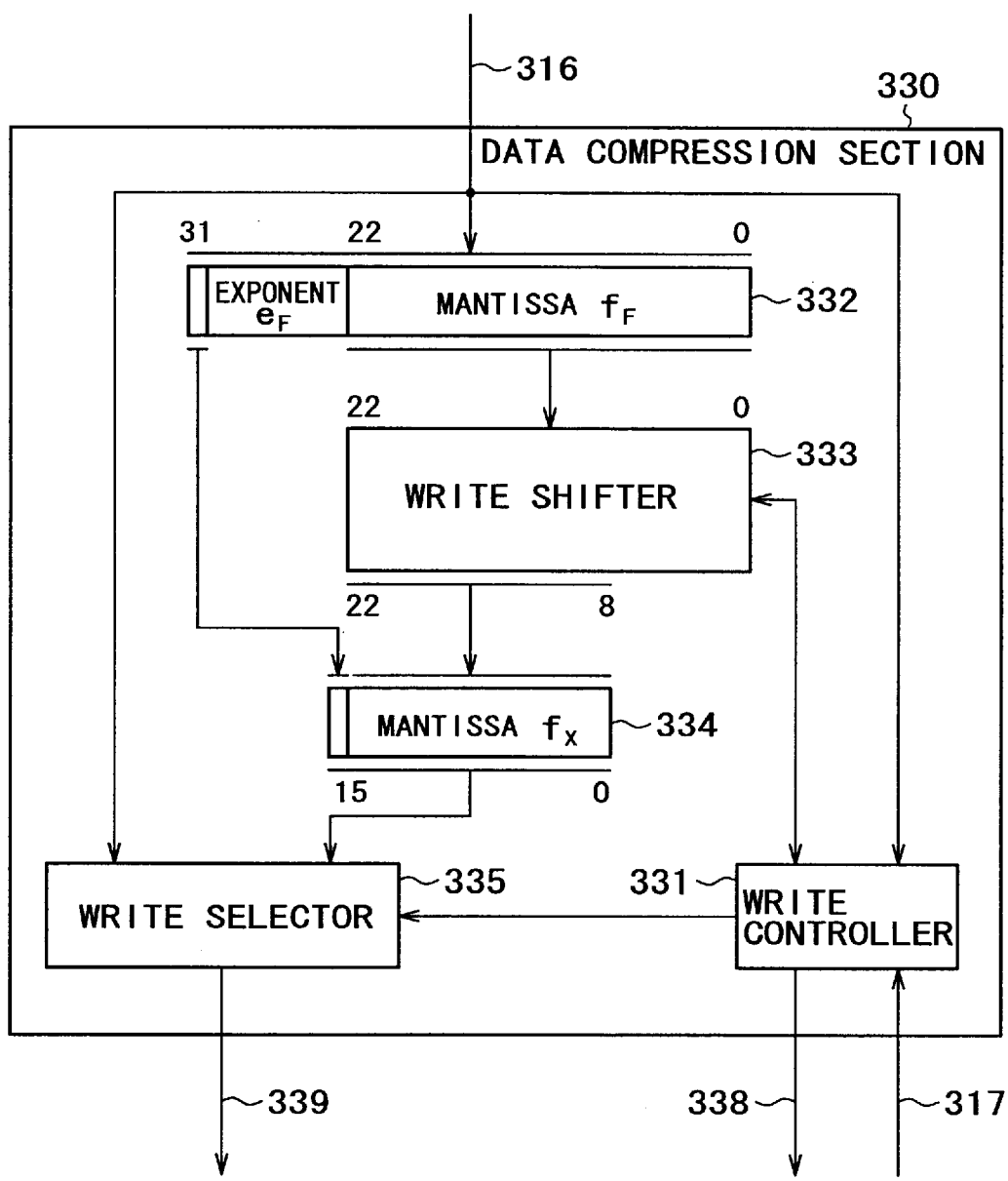
FIG. 7 is a block diagram showing a configuration of a data compression section of the data conversion apparatus of FIG. 1.

Referring to FIG. 7, the data compression section 330 includes a write controller 331, a write shifter 333, and a write selector 335. In the example illustrated in FIG. 7, data 332 inputted from the bus interface 310 through the data signal line 316 is composed of 32 bits. If it is assumed that a bit number is applied to each of the 32 bits in an ascending order from the least significant bit toward the most significant bit beginning with zero, then if the data 332 is data of the floating-point point format, then it includes a code part $s_F$ of 1 bit at the 31st bit, an exponent part $e_F$ of 8 bits at the 30th bit to the 23rd bit, and a mantissa part $f_F$ of 23 bits at the 22nd bit to the 0th bit.

The write shifter 333 rightwardly shifts the 23 bits at the 22nd bit to the 0th bit of the data 332 in accordance with a number of times indicated by the write controller 331. In prior to the right shift, "1" of 1 bit is first supplemented to the left side of the 22nd bit. Consequently, after a first time right shifting cycle, "1" appears at the 22nd bit, and after a second time or later right shifting cycle, "0" appears at the 22nd bit. Further, after the shift by the write shifter 333, a number of digits for 15 bits from the high order side are handled as represented digits, and those bits which are placed outside the representation digits by the right shift are handled as disappeared digits. The data obtained by the right shift in this manner are set to the 15 bits from the 14th bit to the 0th bit of data 334. Further, the data at the most significant bit (31st bit) of the data 332 is set to the most significant bit (15th bit) of the data 334. Consequently, if the data 332 is data of the floating-point format, then the data 334 represents data of the fixed-point format after the conversion.

The write controller 331 assumes that the 8 bits at the 30th bit to the 23rd bit of the data 332 inputted from the bus interface 310 through the data signal line 316 are the exponent part $e_F$ of data of the floating-point format. The write controller 331 further assumes that the 8 bits at the 28th bit to the 21st bit of the address of the address signal line 317 from the bus interface 310 are the exponent part $e_x$ of data of the fixed-point format. Under the assumptions, the write controller 331 instructs the write shifter 333 to perform a right shifting cycle by a number of times equal to $e_x-e_F$. If the number of times of a shifting cycle in this instance, that is, $e_x-e_F$, is smaller than zero, then since this signifies that a value exceeding the range has been written, the write controller 331 notifies the bus interface 310 of an interruption representing this through the interruption signal line 338.

Further, the write controller 331 discriminates whether or not the 3 bits at the 31st bit to the 29th bit of the address of the address signal line 317 from the bus interface 310 are "001". In other words, the write controller 331 discriminates whether or not the address is within the region of the floating-point data space V 420 (FIG. 3).

Furthermore, the write controller 331 discriminates whether or not the data 332 inputted from the bus interface 310 through the data signal line 316 is one of special values. If the data 332 is one of the special values, then the write controller 331 instructs the write selector 335 to output such a value as specified below. In particular, if the exponent part $e_F$=ffh, the mantissa part $f_F$=0 and the code part $s_F$=0, then since the data 332 represents the positive infinity, the write controller 331 outputs "7fffh" which is the highest value of the fixed-point format. If the exponent part $e_F$=ffh, the mantissa part $f_F$=0 and the code part $s_F$=1, then since the data 332 represents the negative infinity, the write controller 331 outputs "ffffh" which is the lowest value of the fixed-point format. If the exponent part $e_F$=ffh and the mantissa part $f_F$ is any other than 0, then since the data 332 represents a NaN value, the write controller 331 outputs "8000h" which is a NaN value of the fixed-point format. If the exponent part $e_F$=0h and the mantissa part $f_F$=0, then since the data 332 represents positive or negative zero, the write controller 331 outputs "0000h" which is zero of the fixed-point format. If the exponent part $e_F$=0h and the mantissa part $f_F$ is any other than 0, then since the data 332 represents a non-normalized value, the write controller 331 performs ordinary conversion without supplementing "1" to the left side of the 22nd bit upon the right shift described above. Further, when the write controller 331 performs conversion of any of the special values specified above, it notifies the bus interface 310 of an interruption representing that the event has occurred through the interruption signal line 338.

The write selector 335 outputs the data 334 to the data signal line 339 if the write controller 331 discriminates based on the 3 bits at the 31st bit to the 29th bit of the address of the address signal line 317 from the bus interface 310 that the address is within the region of the floating-point data space V 420. However, if the write controller 331 discriminates that the address is outside of the region of the floating-point data space V 420, then it outputs the data 332 inputted from the bus interface 310 through the data signal line 316 as it is to the data signal line 339.

Figure 8:
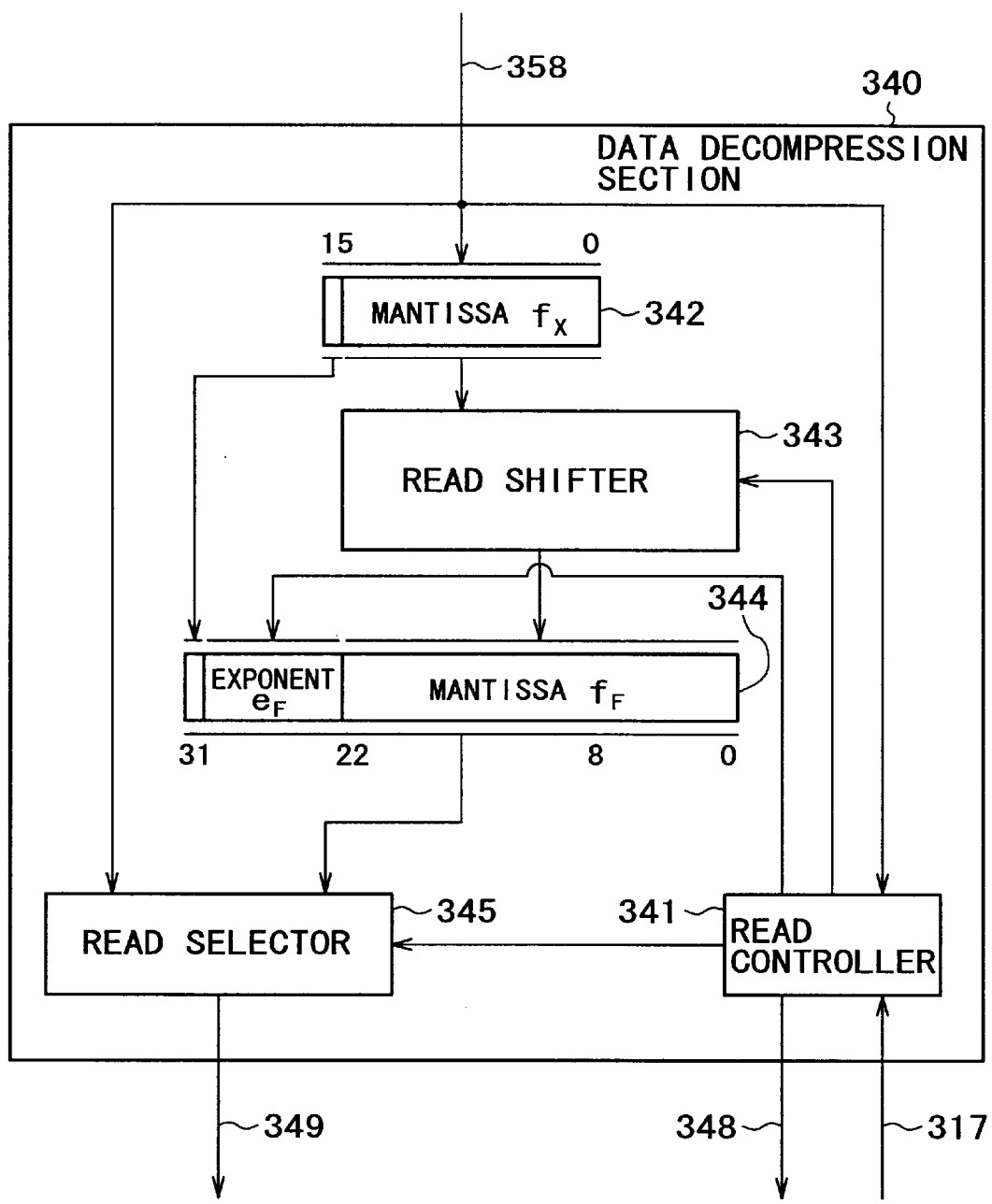
FIG. 8 is a block diagram showing a configuration of a data decompression section of the data conversion apparatus of FIG. 1.

Referring now to FIG. 8, the data decompression section 340 includes a read controller 341, a read shifter 343, and a read selector 345. In the example illustrated in FIG. 8, data 342 inputted from the memory interface 350 through the data signal line 358 is composed of 16 bits. If it is assumed that a bit number is applied to each of the 16 bits in an ascending order from the least significant bit toward the most significant bit beginning with zero, then if the data 342 is data of the fixed-point format, then it includes a code part $s_x$ of 1 bit at the 15th bit and a mantissa part $f_x$ of 15 bits at the 14th bit to the 0th bit.

The read shifter 343 leftwardly shifts the 15 bits at the 14th bit to the 0th bit of the data 342 repetitively until the bit "1" is shifted out from the left side of the 14th bit. Then, 15-bit data after the end of the shift is set to the 8 bits at the 22nd bit to the 8th bit of data 344. Further, "0" is set to all of the 8 bits at the 7th bit to the 0th bit of the data 344, and the value of the most significant bit (15th bit) of the data 342 is set to the most significant bit (31st bit) of the data 344.

The read controller 341 assumes that the number of times by which the read shifter 343 performs a left shifting cycle is n and that the 8 bits at the 28th bit to the 21st bit of the address of the address signal line 317 from the bus interface 310 are the exponent part $e_x$ of data of the fixed-point format. Under the assumptions, the read controller 341 sets $e_x$–n to the 8 bits at the 30th bit to the 23rd bit of the data 344.

Further, the read controller 341 discriminates whether or not the 3 bits at the 31st bit to the 29th bit of the address at the address signal line 317 from the bus interface 310 are "001". In other words, the read controller 341 discriminates whether or not the address is within the region of the floating-point data space V 420 (FIG. 3).

Furthermore, the read controller 341 discriminates whether or not the data 342 inputted from the memory interface 350 through the data signal line 358 is one of special values. If the data 342 is one of the special values, then the read controller 341 instructs the read selector 345 to output such a value as specified below. In particular, if the mantissa part $f_x$=0 and the code part $s_x$=0, then since the data 342 represents zero, the read controller 341 outputs, for example, "00000000h" which is positive zero of the fixed-point format. If the mantissa part $f_x$=0 and the code part $s_x$=1, then since the data 342 represents a NaN value, the read controller 341 outputs, for example, "7fffffffh" which is a NaN value of the fixed-point format. Further, if the read controller 341 performs a conversion of any of the special values specified above, then it notifies the bus interface 310 of an interruption representing that the event has occurred through the interruption signal line 348.

The read selector 345 outputs the data 344 to the data signal line 349 if the read controller 341 discriminates based on the 3 bits at the 31st bit to the 29th bit of the address of the address signal line 317 from the bus interface 310 that the address is within the region of the floating-point data space V 420. However, if the read controller 341 discriminates that the address is outside the region of the floating-point data space V 420, then it outputs the data 342 inputted from the memory interface 350 through the data signal line 358 as it is to the data signal line 349.

Figure 9:
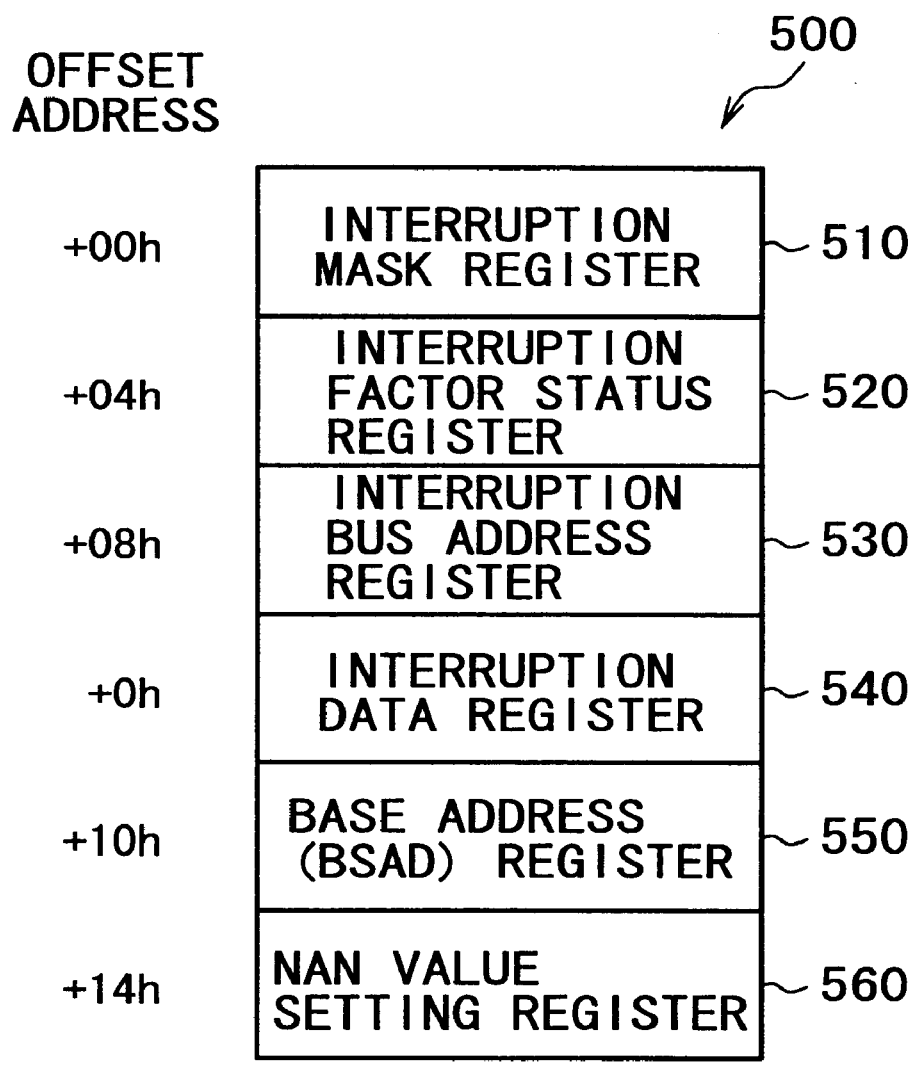
FIG. 9 is a block diagram showing a configuration of a control register of the data conversion apparatus of FIG. 1.

Referring to FIG. 9, there are shown control registers 500 provided in the bus interface 310. The control registers 500 include an interruption mask register 510, an interruption factor status register 520, an interruption bus address register 530, an interruption data register 540, a base address register 550, and a NaN value setting register 560.

The interruption mask register 510 is used to control for each of factors of an interruption whether or not an interruption occurring in the data conversion apparatus 300 should be reported to the processing apparatus 100, and can mask an interruption arising from a particular factor so that the interruption may not be reported. The interruption factor status register 520 stores whether or not an interruption occurs for each factor of an interruption. The interruption bus address register 530 stores a bus address when an interruption occurs. The interruption data register 540 stores data of a factor from which an interruption arises. The base address register 550 stores a base address representative of a start address of the fixed-point data space R 411. The NaN value setting register 560 is used to set a NaN value when a value other than "7fffffffh" specified as above is to be allocated as a NaN value.

The control registers 500 are mapped to the sub address space V255 of the floating-point data space V 420 (FIG. 3) and can be referred to each with an offset address of FIG. 9 beginning with a radix point of "3fe00000h".

Now, a flow of processing of the data conversion apparatus of the present embodiment is described with reference to the drawings.

Figure 10:
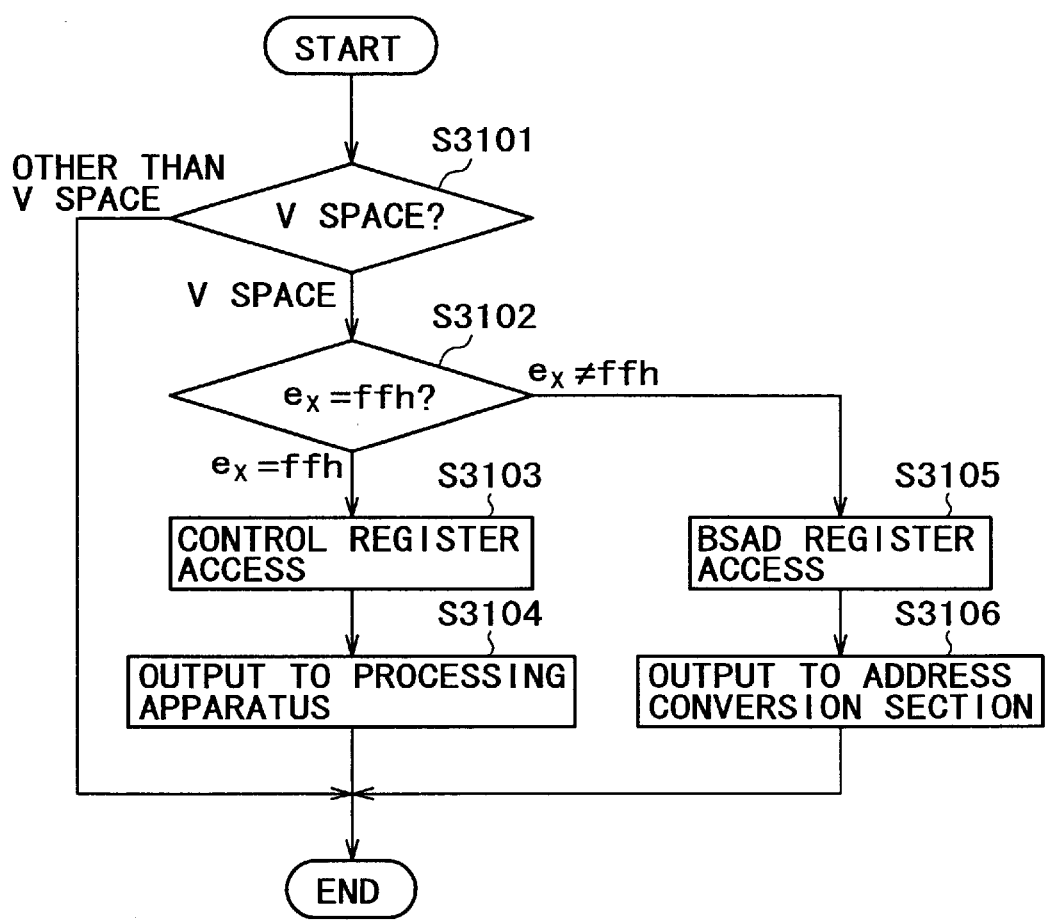
FIG. 10 is a flow chart illustrating a flow of processing of a bus interface of the data conversion apparatus of FIG. 1.

Referring to FIG. 10, the bus interface 310 discriminates whether or not an address received from the processing apparatus 100 is within the range of the floating-point data space V 420 (step S3101). If the address is not within the range of the floating-point data space V 420, then the bus interface 310 passes the address as it is to the address conversion section 320, data compression section 330 and data decompression section 340. If the address is within the range of the floating-point data space V 420, then the bus interface 310 further discriminates whether or not the exponent part $e_x$ of the address is ffh (255) (step S3102). If the exponent part $e_x$ is ffh, then the bus interface 310 accesses the control registers 500 (FIG. 9) (step S31013) and outputs a result of the accessing to the processing apparatus 100 (step S3104). On the other hand, if the exponent part $e_x$ is not ffh, then bus interface 310 reads out the stored contents of the base address register 550 in the control registers 500 (FIG. 9) (step S3105) and outputs the read out contents to the address conversion section 320 through the base address signal line 315 (step S3106) in order to perform address conversion of the address into an address in the fixed-point data space R 411.

Figure 11:
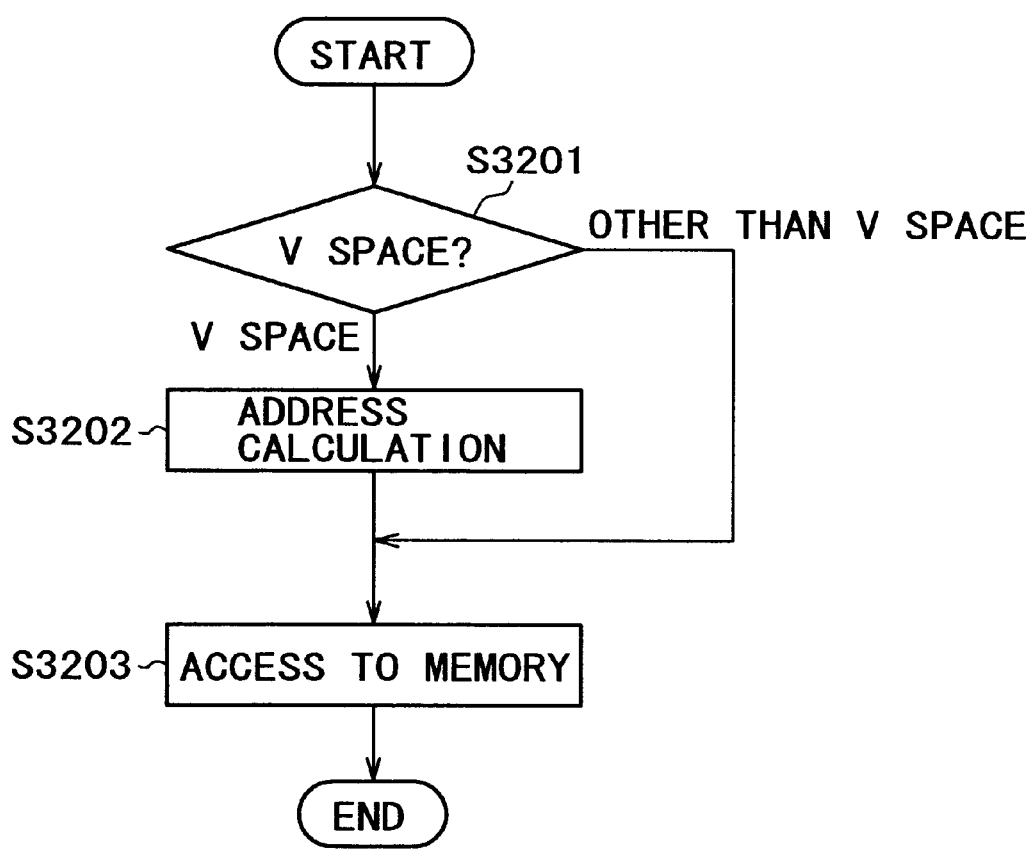
FIG. 11 is a flow chart illustrating a flow of processing of the address conversion section shown in FIG. 6.

Referring to FIG. 11, the address conversion section 320 discriminates based on the address received from the bus interface 310 through the address signal line 317 whether or not the address indicates an access to the region of the floating-point data space V 420 (step S3201). If the address conversion section 320 discriminates an access to the region of the floating-point data space V 420, then it performs address conversion of the address into an address in the fixed-point data space R 411 (step S3202), and outputs the address after the conversion to the address signal line 329. On the other hand, if the address indicates an access to the outside of the region of the floating-point data space V 420, then the address conversion section 320 outputs the address before the conversion as it is to the address signal line 329. The address is outputted to the memory interface 350 through the address signal line 329 and used for an access to the memory 400 (step S3203).

Figure 12:
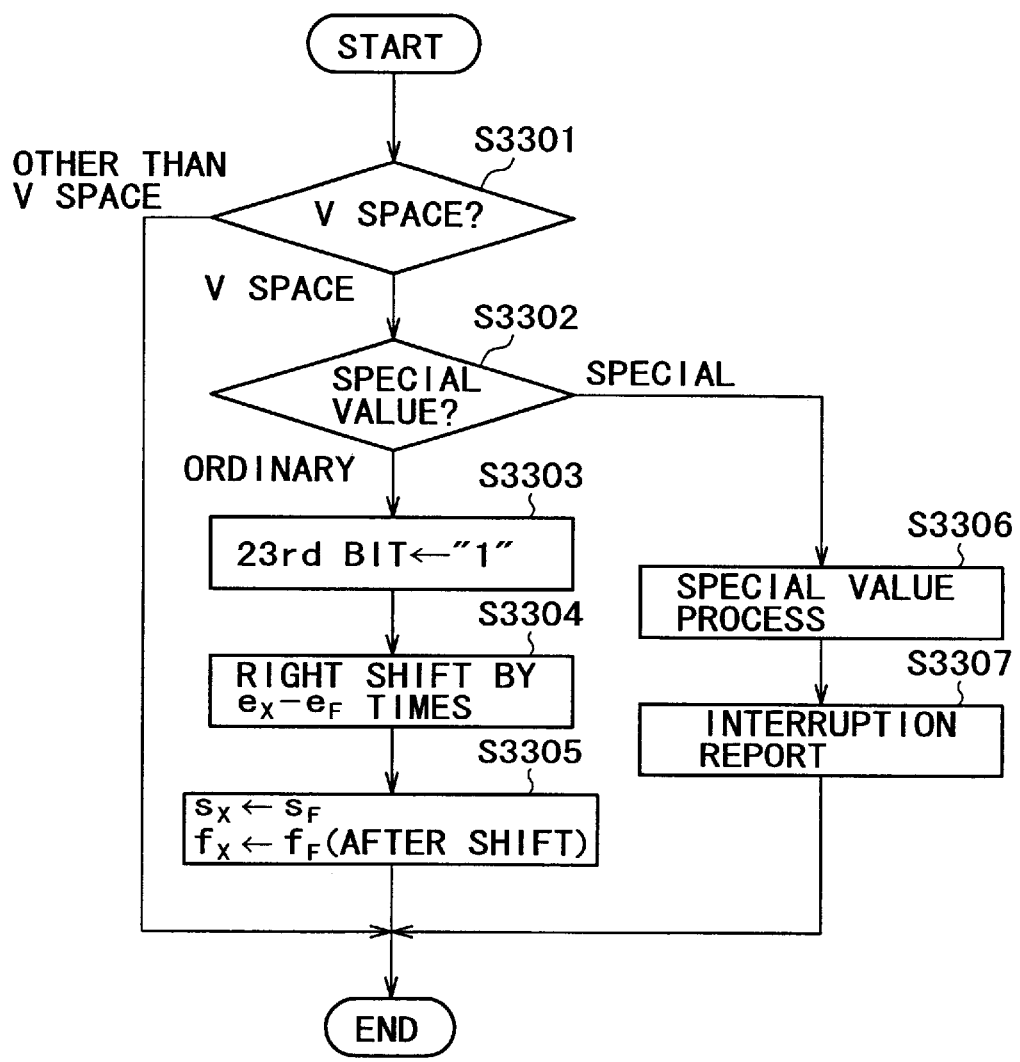
FIG. 12 is a flow chart illustrating a flow of processing of the data compression section shown in FIG. 7.

Referring now to FIG. 12, the data compression section 330 discriminates whether or not the write address received from the bus interface 310 is within the range of the floating-point data space V 420 (step S3301). If the write address is not within the range of the floating-point data space V 420, then the data compression section 330 outputs the write data received from the bus interface 310 as it is to the memory interface 350. On the other hand, if the write address is within the range of the floating-point data space V 420, then the data compression section 330 further discriminates whether or not the write data received from the bus interface 310 is one of the special values (step S3302). If the write data is not any one of the special values, then the data compression section 330 supplements "1" to the bit on the left side of the mantissa part $f_F$ of the data of the floating-point format (step S3303) and shifts the resulting mantissa part $f_F$ rightwardly by a predetermined number of times (step S3304). The number of times of such right shifting cycles depends upon the difference between a predetermined portion (the exponent part $e_x$) of the write address corresponding to the writing instruction and the exponent part $e_F$ of the data of the floating-point format as described hereinabove. Then, the data compression section 330 sets the mantissa part $f_F$ after the shift as the mantissa part $f_x$ of data of the fixed-point format and sets the code part $s_F$ of the data of the floating-point format as the code part $s_x$ of the data of the fixed-point format (step S3305).

On the other hand, if it is discriminated at step S3302 that the write data received from the bus interface 310 is one of the special values, then the data compression section 330 replaces the special value of the floating-point format with a corresponding special value of the fixed-point format as described hereinabove (step S3306). Further, the data compression section 330 notifies the bus interface 310 of an interruption representing that a conversion operation of a special value has been performed through the interruption signal line 338 (step S3307).

Figure 13:
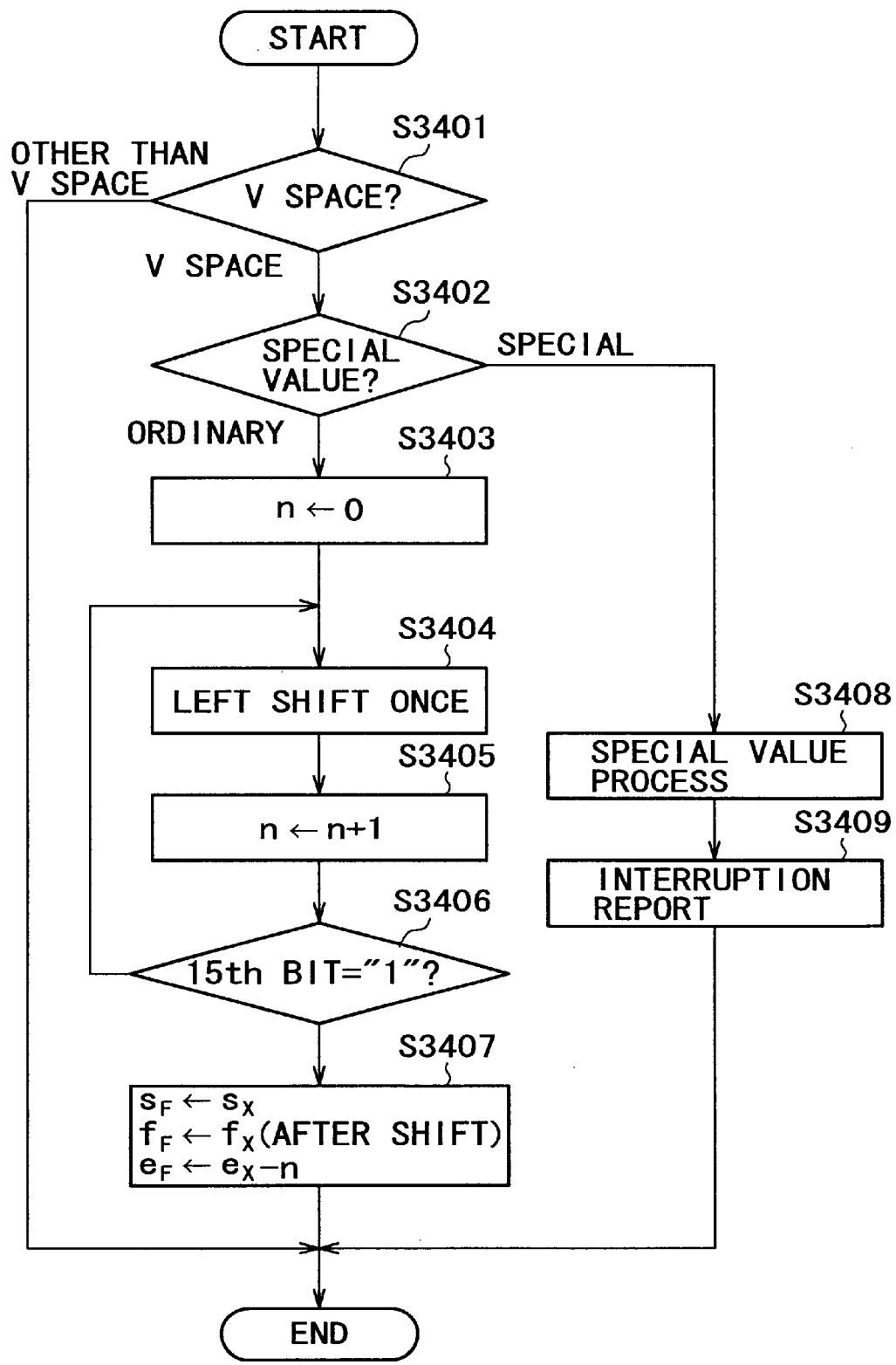
FIG. 13 is a flow chart illustrating a flow of processing of the data decompression section shown in FIG. 8.

Referring now to FIG. 13, the data decompression section 340 discriminates whether or not the read address received from the bus interface 310 is within the range of the floating-point data space V 420 (step S3401). If the read address is not within the range of the floating-point data space V 420, then the data decompression section 340 outputs the read data received from the memory interface 350 as it is to the bus interface 310. On the other hand, if the read address is within the range of the floating-point data space V 420, then the data decompression section 340 further discriminates whether or not the read data received from the memory interface 350 indicates one of the special values (step S3402). If the read data is not any one of the special values, then the data decompression section 340 performs a left shifting operation of the mantissa part $f_x$ repetitively until "1" is shifted out from the bit on the left side of the mantissa part $f_x$ of the data of the fixed-point format and represents the number of times by which the left shifting operation is performed as n (steps S3403 to S3406). Then, the data decompression section 340 sets the mantissa part $f_x$ after the end of the series of shifting operations as the mantissa part $f_F$ of the data of the floating-point format and sets the code part $s_x$ of the data of the fixed-point format as the code part $s_F$ of the data of the floating-point format (step S3407). Further, the data decompression section 340 subtracts n from the exponent part $e_x$ of the data of the fixed-point format and sets the resulting value $e_x$–n to the exponent part $e_F$ of the data of the floating-point format (step S3407).

On the other hand, if it is discriminated at step S3402 that the read data received from the memory interface 350 indicates one of the special values, then the data decompression section 340 replaces the special value of the fixed-point format into a corresponding special value of the floating-point format as described hereinabove (step S3408). Further, the data decompression section 340 notifies the bus interface 310 of an interruption representing that a conversion operation of a special value has been performed through the interruption signal line 348 (step S3409).

In this manner, with the data conversion apparatus of the present embodiment, upon writing of data into the memory 400, such writing is performed after conversion of data of the floating-point format into data of the fixed-point format by the data compression section 330. On the other hand, upon reading out of data from the memory 400, data of the fixed-point format is converted into data of the floating-point format by the data decompression section 340 and the data obtained by the conversion is received by the processing apparatus 100. Consequently, while the processing apparatus 100 can handle data of the floating-point format, compact data of the fixed-point format can be stored into the memory 400.

Further, with the data conversion apparatus of the present embodiment, since part of an address is used as the exponent part of data of the fixed-point format, the dynamic range can be adjusted readily while the bit width of the mantissa part of the data of fixed-point format is kept effective.

It is to be noted that, while the data conversion apparatus of the embodiment described above uses conversion between 32-bit data of the floating-point format and 16-bit data of the fixed-point format as an example of conversion, the present invention is not limited to this. In particular, the present invention can be applied generally to conversion of data of a first format into data of a second format to be outputted to a memory or conversion of data of the second format outputted from the memory into data of the first format only if data of the first format can be approximated with a predetermined portion of an address and data of the second format.

Further, while, in the embodiment described above, the present invention is applied to a data conversion apparatus, the present invention is not limited to this but can be carried out also as a data conversion method executed by a computer. Also a program for carrying out the data conversion apparatus and a recording medium on which the program is recorded are included in the scope of the present invention.

While a preferred embodiment of the present invention has been described using specific terms, such description is for illustrative purposes only, and it is to be understood that changes and variations may be made without departing from the spirit or scope of the following claims.

What is claimed is:

1. A data conversion apparatus, comprising:
   approximation means operable when a writing instruction for writing first data having a first format into a memory is received from a processing apparatus for approximating the first data with a predetermined portion of a write address directed by the writing instruction and second data having a second format; and
   conversion data writing means for writing the second data specified by said approximation means in place of the first data into said memory.

2. The data conversion apparatus according to claim 1, wherein the data of the first format is data of a floating-point format while the data of the second format is data of a fixed-point format.

3. The data conversion apparatus according to claim 2, wherein the first data includes an exponent part and a mantissa part while the second data includes a mantissa part, and the predetermined portion of the write address includes the exponent part of the data of the fixed-point format.

4. A data conversion apparatus, comprising:
   approximation means operable when a reading instruction for reading out first data having a first format from a memory is received from a processing apparatus for approximating the first data with a predetermined portion of a read address directed by the reading instruction and second data having a second format; and
   conversion data reading means for reading out the second data specified by said approximation means in place of the first data from said memory.

5. The data conversion apparatus according to claim 4, wherein the data of the first format is data of a floating-point format while the data of the second format is data of a fixed-point format.

6. A data conversion apparatus which converts, in response to a writing instruction outputted from a processing apparatus for writing data of a first format into a memory, the data of the first format into data of a second format, comprising:
   means for generating a signal according to a predetermined portion of a write address directed by the writing instruction outputted from said processing apparatus and a first predetermined portion of the data of the first format; and
   means for performing a predetermined operation for a second predetermined portion of the data of the first format in accordance with said signal to obtain a predetermined portion of the data of the second format.

7. The data conversion apparatus according to claim 6, wherein the data of the first format is data of a floating-point format while the data of the second format is data of a fixed-point format.

8. The data conversion apparatus according to claim 6, further comprising:
   means for converting the write address into a predetermined address;
   means for detecting that the write address is within a predetermined region; and
   means for outputting said predetermined address to said memory if it is detected that the write address is within the predetermined region, but outputting the write address as it is to said memory if it is not detected that the write address is within the predetermined region.

9. The data conversion apparatus according to claim 6, further comprising:
   means for detecting that the write address is within a predetermined region; and
   means for outputting the data of the second format to said memory if it is detected that the write address is within the predetermined region, but outputting the data outputted from said processing apparatus as it is to said memory if it is not detected that the write address is within the predetermined region.

10. The data conversion apparatus according to claim 6, further comprising:
    means for detecting that the data of the first format has a predetermined numerical value; and
    means for outputting predetermined data to said memory if it is detected that the data of the first format has the predetermined numerical value.

11. A data conversion apparatus which converts, in response to a reading instruction outputted from a processing apparatus for reading out data of a first format from a memory, data of a second format outputted from said memory into data of the first format which includes a first predetermined portion and a second predetermined portion, comprising:
    means for repetitively performing a predetermined operation for a predetermined portion of the data of the second format until a predetermined condition is satisfied to obtain the second predetermined portion of data of the first format; and
    means for determining the first predetermined portion of the data of the first format based on a predetermined portion of a read address directed by the reading instruction outputted from said processing apparatus and the number of times by which the predetermined operation is performed.

12. The data conversion apparatus according to claim 11, wherein the data of the first format is data of a floating-point format while the data of the second format is data of a fixed-point format.

13. The data conversion apparatus according to claim 11, further comprising:
    means for converting the read address into a predetermined address;
    means for detecting that the read address is within a predetermined region; and
    means for outputting said predetermined address to said memory if it is detected that the read address is within the predetermined region, but outputting the read address as it is to said memory if it is not detected that the read address is within the predetermined region.

14. The data conversion apparatus according to claim 11, further comprising:
    means for detecting that the read address is within a predetermined region; and
    means for outputting the data of the first format to said processing apparatus if it is detected that the read address is within the predetermined region, but outputting the data read out from said memory as it is to said processing apparatus if it is not detected that the read address is within the predetermined region.

15. The data conversion apparatus according to claim 11, further comprising:
    means for detecting that the data of the second format has a predetermined numerical value; and
    means for outputting predetermined data to said processing apparatus if it is detected that the data of the second format has the predetermined numerical value.

16. A data conversion method for converting, in response to a writing instruction outputted from a processing apparatus for writing data of a first format into a memory, the data of the first format into data of a second format, comprising the steps of:
    generating a signal according to a predetermined portion of a write address directed by the writing instruction outputted from said processing apparatus and a first predetermined portion of the data of the first format; and
    performing a predetermined operation for a second predetermined portion of the data of the first format in accordance with said signal to obtain a predetermined portion of the data of the second format.

17. The data conversion method according to claim 16, wherein the data of the first format is data of a floating-point format while the data of the second format is data of a fixed-point format.

18. The data conversion method according to claim 16, further comprising:
    a step executed by a computer of converting the write address into a predetermined address;
    a step executed by said computer of detecting that the write address is within a predetermined region; and
    a step executed by said computer of outputting said predetermined address to said memory if it is detected that the write address is within the predetermined region, but outputting the write address as it is to said memory if it is not detected that the write address is within the predetermined region.

19. The data conversion method according to claim 16, further comprising:
    a step executed by a computer of detecting that the write address is within a predetermined region; and
    a step executed by said computer of outputting the data of the second format to said memory if it is detected that the write address is within the predetermined region, but outputting the data outputted from said processing apparatus as it is to said memory if it is not detected that the write address is within the predetermined region.

20. The data conversion method according to claim 16, further comprising:
    a step executed by a computer of detecting that the data of the first format has a predetermined numerical value; and
    a step executed by said computer of outputting predetermined data to said memory if it is detected that the data of the first format has the predetermined numerical value.

* * * * *